United States Patent [19]

Doba et al.

[11] Patent Number: 5,445,918
[45] Date of Patent: Aug. 29, 1995

[54] PHOTOPOLYMERISABLE COMPOSITIONS

[75] Inventors: Takahisa Doba; Bunya Watanabe, both of Ibaraki, Japan

[73] Assignee: Zeneca Limited, London, England

[21] Appl. No.: 208,789

[22] Filed: Mar. 10, 1994

Related U.S. Application Data

[63] Continuation of Ser. No. 827,046, Jan. 29, 1992, abandoned.

[30] Foreign Application Priority Data

Jan. 29, 1991 [JP] Japan .................. 3-009309

[51] Int. Cl.⁶ .............. G03C 1/725; G03F 7/028; C08F 2/48; C08J 3/28
[52] U.S. Cl. ................... 430/285; 430/288; 522/22; 522/28; 522/66
[58] Field of Search .................. 522/26, 28, 66; 430/285, 288

[56] References Cited

U.S. PATENT DOCUMENTS

| | | | |
|---|---|---|---|
| 4,278,751 | 7/1981 | Specht | 522/14 |
| 4,289,844 | 9/1981 | Specht | 430/281 |
| 4,857,654 | 8/1989 | Riediker | 522/26 |
| 4,987,056 | 1/1991 | Imahashi | 522/14 |
| 4,987,057 | 1/1991 | Kaji | 522/65 |
| 5,008,302 | 4/1991 | Husler | 430/281 |
| 5,034,429 | 7/1991 | Kaji | 522/14 |
| 5,049,479 | 9/1991 | Zertani | 522/29 |
| 5,112,721 | 5/1992 | Kuchta | 522/14 |
| 5,153,236 | 10/1992 | Kaji | 522/14 |

*Primary Examiner*—Mark A. Chapman
*Attorney, Agent, or Firm*—Cushman Darby & Cushman

[57] ABSTRACT

High sensitivity photopolymerisable compositions comprising a polymerisable ethylenically unsaturated compound and a photoinitiator composition comprising a titanocene compound and N-phenylglycine or a derivative thereof.

11 Claims, 4 Drawing Sheets

PHOTOPOLYMERISABLE COMPOSITIONS

This is a continuation of application Ser. No. 07/827,046, filed on Jan. 29, 1992, which was abandoned upon the filing hereof.

FIELD OF THE INVENTION

This invention relates to photopolymerisable compositions and more particularly to photopolymerisable compositions comprising a polymerisable ethylenically unsaturated compound and a photoinitiator.

1. Background of the Invention

The use of photoinitiators to enhance the photosensitivity of photopolymerisable compositions to the effects of actinic radiation is well known. Such photoinitiators include azides, quinone-azides, diazonium salts, photocleavage type initiators such as benzoin ethers, acetophenones and benzilketal and hydrogen abstraction initiators such as ketones and ketone-amine combinations. These photoinitiators are particularly sensitive to ultra-violet radiation.

Recently, materials which are photosensitive in the visible light region have become of interest as alternative imaging materials in laser system to silver salts. However, the use of such materials requires not only a shift of photosensitivity into the visible light region but also a considerable improvement in sensitivity.

Various photopolymerisable compositions have been proposed for such purpose and these have included the system of thiapyrylium salts and triazines described in Japanese Patent Disclosure 58-40302, the system comprising a dialkylaminostyrene or dialkylaminophenylbutadiene derivative, a hexa-aryl-bis-imidazole and a thiol compound described in Japanese Patent Disclosure 59-56403 and the system of aromatic ketones and amino(meth)acrylates described in Japanese Patent Disclosure 61-228002. Unfortunately, however, the sensitivities of these systems are insufficient for photopolymerisation when using an argon ion laser.

2. Summary of the Invention

It has now been found that combinations of titanocene compounds and phenylglycine compounds provide very efficient photoinitiator compositions possessing a high level of photosensitivity in both the ultra-violet and visible regions of the spectrum.

Accordingly, the present invention provides a photopolymerisable composition comprising a polymerisable ethylenically unsaturated compound and a photoinitiator composition comprising a titanocene compound and N-phenylglycine or a derivative thereof.

It is believed that the high sensitivity of the photoinitiator compositions of the invention is caused by rapid photodecomposition of the titanocene compounds due to formation of a complex between excited titanocene compounds and N-phenylglycine compounds followed by electron migration into the titanocene compound or that, since a titanocene compound is unstable in the presence of an acid or a base, the titanocene compound is efficiently decomposed by the radiation in the presence of the weak acid of the N-phenylglycine compounds. It is to be understood, however, that the invention is not restricted by any theory as to the precise mechanism by which the components of the photoinitiator composition function.

DETAILED DESCRIPTION OF THE PREFERRED EMBODIMENTS

Titanocene compounds and their use as photoinitiators for the photopolymerisation of polymerisable ethylenically unsaturated compounds have been described in the prior art, for example in EP-A-0122223 and EP-A-0318894. Preferred photoinitiator compositions for use in accordance with the present invention contain one or more of the titanocene compounds described in the aforementioned European specifications.

Thus, particularly useful titanocene compounds include titanocenes having two unsubstituted or substituted cyclopentadienyl ligands and one or two unsubstituted or substituted 6-membered carbocyclic or 5- or 6-membered heterocyclic aromatic radicals attached to the titanium atom. In preferred compounds, the aromatic radicals have a fluorine substituent in at least one of the two ortho positions relative to the titanium - carbon bond and optionally have further substituents.

Substituents which may optionally be present on the cyclopentadiene rings include $C_1$–$C_{18}$-alkyl and alkoxy, especially $C_1$–$C_6$-alkyl and alkoxy such as methyl, ethyl, propyl, methoxy, ethoxy and propoxy, $C_2$–$C_{18}$-alkenyl, $C_5$–$C_8$-cycloalkyl and cycloalkenyl, $C_6$–$C_{16}$-aryl, $C_7$–$C_{16}$-aralkyl and halogen, for example chlorine. The same substituents may optionally be present on the carbocyclic or heterocyclic aromatic radicals as may also other substituents such as amino groups, especially tertiary amino groups which may optionally be quaternised and may be derived from heterocyclic amines such as pyrrolidine, piperidine, piperazine, N-methylpiperazine, morpholine, pyrrole and pyridine.

Specific examples of useful titanocene compounds include bis(cyclopentadienyl)-bis[2,6-difluoro-3-(1-pyrrolyl)phenyl]-titanium available from Ciba-Geigy as CGI-784, bis(cyclopentadienyl)-bis(pentafluorophenyl)-titanium and bis(cyclopentadienyl)-bis(2,3,5,6-tetrafluoro-4-decyloxyphenyl)-titanium.

Phenylglycine derivatives which may be present in the photoinitiator compositions include N-phenylglycines having a substituent in at least one position on the aromatic ring. Examples of suitable substituents include electron-donating moieties such as $C_1$–$C_6$-alkyl and alkoxy, for example methyl and methoxy, and electron-withdrawing moieties such as amino, nitro, cyano or halogen. Other useful phenylglycine derivatives include carboxylic acid salts of N-phenylglycine itself or of any of the substituted phenylglycines. Mixtures of N-phenylglycine with one or more derivatives thereof or mixtures of two or more N-phenylglycine derivatives may be used if desired.

The polymerisable ethylenically unsaturated compound present in the photopolymerisable composition of the invention will generally be a monomeric, oligomeric or polymeric compound which contains at least one ethylenically unsaturated double bond per molecule and which reacts by photopolymerisation to give higher molecular weight products which are generally insoluble in solvents. Mixtures of two or more such compounds may be used if desired.

Suitable polymerisable ethylenically unsaturated compounds have been fully described in the prior art and include, for example, unsaturated carboxylic acids and the esters, amides and nitriles thereof.

Especially suitable ethylenically unsaturated compounds include unsaturated carboxylic esters obtainable by reacting one or more unsaturated carboxylic acids or a mixture of one or more such acids and one or more polycarboxylic acids with one or more compounds selected from polyhydroxyaliphatic compounds, polyhydroxyaromatic compounds and epoxy compounds.

Examples of ethylenically unsaturated carboxylic acids include acrylic acid, methacrylic acid, itaconic acid, crotonic acid, maleic acid and the like.

Examples of polyhydroxyaliphatic compounds include polyhydroxyalkanes, for example diols such as ethylene glycol, diethylene glycol, triethylene glycol, tetraethylene glycol, neopentyl glycol, propylene glycol and 1,2-butanediol, triols such as glycerol and trimethylolpropane, tetrols such as pentaerythritol and hexols such as dipentaerythritol and sorbitol. Oxyalkylated bis-phenols can also be used.

Examples of polyhydroxyaromatic compounds include polyhydroxybenzenes, for example hydroquinone, resorcinol and pyrogallol.

Examples of epoxy compounds include polyglycidyl ethers of propylene glycol, trimethylolpropane, pentaerythritol and bisphenol A, and diglycidyl phthalate.

Examples of polycarboxylic acids include phthalic acid, isophthalic acid, terephthalic acid, tetrachlorophthalic acid, trimellitic acid, pyromellitic acid, benzophenone dicarboxylic acid, maleic acid, fumaric acid, malonic acid, glutaric acid, adipic acid, sebacic acid and tetrahydrophthalic acid.

Preferred unsaturated esters include the esters derived from the above mentioned polyhydroxyaliphatic or polyhydroxyaromatic compounds and acrylic or methacrylic acid.

Typical examples of unsaturated esters derived by reaction between unsaturated carboxylic acids, polycarboxylic acids and polyhydroxy compounds include the reaction products of acrylic acid and/or methacrylic acid with the following polyols:

bis (diethylene glycol) phthalate
bis (diethylene glycol) adipate
bis (triethylene glycol) maleate
bis (diethylene glycol) trimellitate
bis (trimethylolpropane) phthalate
bis (ethylene glycol) phthalate
bis (pentaerythritol) phthalate
bis (pentaerythritol) maleate
the tris (ethylene glycol) ester of glyceryl triadipate.

The said polyols may be partially or completely esterified by the unsaturated acids.

Other suitable ethylenically unsaturated compounds include acrylamide, methylene-bis-acrylamide, hexamethylene-bis-acrylamide and the corresponding methacrylamide compounds and allyl esters, for example diallyl phthalate, diallyl maleate, diallyl fumarate and triallyl isocyanurate.

Further ethylenically unsaturated compounds include unsaturated polyesters and polyamides containing polymerisable double bonds in the main polymer chain. Such polyesters may be obtained by reaction between unsaturated dicarboxylic acids such as maleic and fumric acids and dihydroxy compounds such as the aforementioned diols. The polyamides may be obtained by reaction between unsaturated dicarboxylic acids and diamines such as ethylenediamine and hexamethylenediamine. Unsaturated polyesters containing polymerisable double bonds in side chains include reaction products of dihydroxy compounds and dicarboxylic acids such as itaconic acid, 2-and 3-methylitaconic acids, propylidenesuccinic acid, 2-ethylideneglutaric acid, ethylidenemalonic acid and propylidenemalonic acid. These acids may also be reacted with diamines to give the corresponding polyamides.

Still further polymers containing polymerisable double bonds in side chains include reaction products of polymers having pendent functional groups such as hydroxy groups and unsaturated carboxylic acids such as acrylic acid, methacrylic and/or crotonic acid. Examples of polymers having pendent reactive moieties include polyvinyl alcohol, partially saponified polyvinyl acetate, a copolymer of acrylonitrile or the like and another monomer such as styrene, vinyl chloride, vinylidene chloride etc., a completely saponified copolymer of acrylonitrile and vinyl acetate, a copolymer of 2-hydroxyethyl methacrylate and another monomer such as acrylonitrile, methyl methacrylate, butyl methacrylate, styrene, vinylidene chloride etc., poly(4-hydroxystyrene) and poly(N-methylol acrylamide). Preferred products are esters derived from acrylic acid and/or methacrylic acid.

The photopolymerisable compositions of the invention suitably contain photoinitiator compositions and polymerisable ethylenically unsaturated compound in a weight ratio or from 1:5 to 1:500, preferably from 1:10 to 1:100. The weight ratio of titanocene compound to N-phenylglycine compound in the photoinitiator compositions is suitably in the range from 10:1 to 1:10, preferably from 2:1 to 1:2.

The use of lower amounts of photoinitiator than indicated above can produce undesirably long photopolymerisation times whilst larger amounts of photoinitiator than indicated can provide products having undesirably low mechanical strength and solvent resistance. However, other photoinitiators may be used in conjunction with the titanocene and N-phenylglycine compounds.

The compositions of the invention may also contain other conventional ingredients, for example solvents, high polymeric binders, inhibitors of thermal polymerisation, plasticisers, pigments and dyes.

Examples of solvents which may be present in the compositions of the invention include ketones such as acetone, methyl ethyl ketone and cyclohexanone, esters such as ethyl acetate and butyl acetate, aromatic solvents, for example aromatic hydrocarbons such as toluene and xylene, cellosolves such as methyl-, ethyl-and butyl-cellosolve, alcohols such as methanol, ethanol and propanol and ethers such as tetrahydrofuran and dioxane.

Polymeric binders for inclusion in the compositions of the invention may have useful effects on solubility, film formation, adhesive strength, etc., and may be chosen according to the particular application. For example, a copolymer of acrylic acid (or methacrylic acid) and an alkyl acrylate (or methacrylate) such as the methyl, ethyl or butyl esters, iraconic acid copolymers, partially esterified maleic acid copolymers, cellulose acetate derivatives having carboxyl substituents, poly-(ethylene oxide) and poly (vinylpyrrolidone) are useful in aqueous systems.

Useful plasticisers include dialkyl esters of phthalic acid such as dioctyl phthalate, didodecyl phthalate and dibutyl phthalate and dialkyl esters of aliphatic dibasic acide such as dioctyl adipate, dibutyl adipate and dibutyl sebacate.

Pigments which may be included in the compositions of the invention include phthalocyanine and azo compounds, carbon black and titanium dioxide. Suitable dyes include triphenylmethane, azo and anthraquinone compounds.

The compositions of the invention may be prepared by mixing the ingredients in a conventional manner. For example, the essential ingredients, with optional components and/or solvent if necessary, may be stirred together in a mixer under dark and cool conditions.

Photosensitive layers may be obtained from the compositions of the invention by applying the composition as coatings or films to various substrates using, for example, a bar coater or a spin coater followed by drying.

Conventional methods can be used to protect the surface of the film from inhibition of photopolymerisation by atmospheric oxygen. Thus, an easily removable thin covering layer can be applied to the photosensitive material, for example a wax having low oxygen permeability or a water soluble polymer.

Photopolymerisation of the compositions of the invention may be effected by subjecting said compositions, preferably in the form of films, to radiation from sources which have emission maxima in the wavelength range where the titanocene compound absorbs, for example in the range from about 200 nm to about 600 nm. Suitable radiation sources include laser light sources, for example argon ion lasers, helium-cadmium lasers and krypton lasers as well as metal halide lamps, xenon lamps, tungsten lamps and medium pressure, high pressure and ultra-high pressure mercury lamps. After exposure to radiation, unexposed areas of the polymerisable composition may be dissolved out using suitable solvents as developers.

Accordingly, in a further aspect of the invention, there is provided a method for the preparation of a polymeric material which comprises irradiating a photopolymerisable composition of the invention with radiation having a wavelength which is capable of being absorbed by the titanocene compound so as to convert it to an excited state.

In a still further aspect of the invention, there is provided a photoinitiator composition comprising a titanocene compound and N-phenylglycine or a derivative thereof.

The photopolymerisable compositions of the invention are useful in the production of light-curable adhesives, films, coatings and inks especially for applications such as holography, laser direct printing and resists.

The invention is illustrated but not limited by the following Examples in which all parts are by weight.

BRIEF DESCRIPTION OF DRAWINGS

The invention is also illustrated by the attached Drawings in which.

Example 1

A photopolymerisable composition (1.B) was prepared by adding 80 parts of Photopolymerisable Composition 1A and 8 parts of a surfactant (Liponox—a product of Lion Corporation) gradually and with fast stirring to 100 parts of Clear Coat M-908-3 (a high polymer binder—a product of Shin-Nakamura Chemical Co. Ltd.).

Photopolymerisable Composition 1A was a product obtained by mixing the following components:

| Light Ester HOA | 50 parts |
| Aronix M-325 | 50 parts |
| CGI-784 | 1 part |
| N-phenylglycine | 1 part |

Light Ester BOA is 2-hydroxyethyl acrylate, a product of Kyoeisha Yushi Chemical Industries KK.

Aronix M-325 is tris (acryloyloxyethyl)isocyanurate modified caprolactone, a product of Toagosei Chemical Industry Co. Ltd.

CGI-784 is bis(cyclopentadienyl)-bis[2,6-difluoro-3-(1-pyrrolyl)phenyl]-titanium.

Photopolymerisable Composition 1B was coated under dark conditions on to a glass plate using a barcoater to give a coating thickness of 100 microns after drying. A photosensitive hologram recording plate was prepared by covering the coating with a glass plate after drying at 40° C. for 90 minutes. The photosensitive plate thus obtained was exposed, using an optical system for the preparation of holograms, to an argon ion laser (wavelength 488 nm, intensity 8 mW/cm$^2$) at 1000 lines/mm spatial frequency, the recording being made with two beams.

The efficiency of the photoinitiator composition was assessed (using a helium-neon laser which is insensitive to the exposed surface) by measuring the time from the start of exposure to the argon ion laser to the point when diffraction efficiency began to increase, that is to say the time for initiation of polymerisation (hereinafter referred to as the "Induction Period") and also the time from the start of exposure to the point when the diffraction efficiency reached an almost saturated, that is to say maximum, value.

A photosensitive material containing a highly efficient and sensitive photoinitiator composition is affected very little by the polymerisation-inhibiting effect of atmospheric oxygen and, accordingly, the Induction Period becomes very short or zero and the time to reach maximum value of diffraction efficiency is also short.

Figure 1:
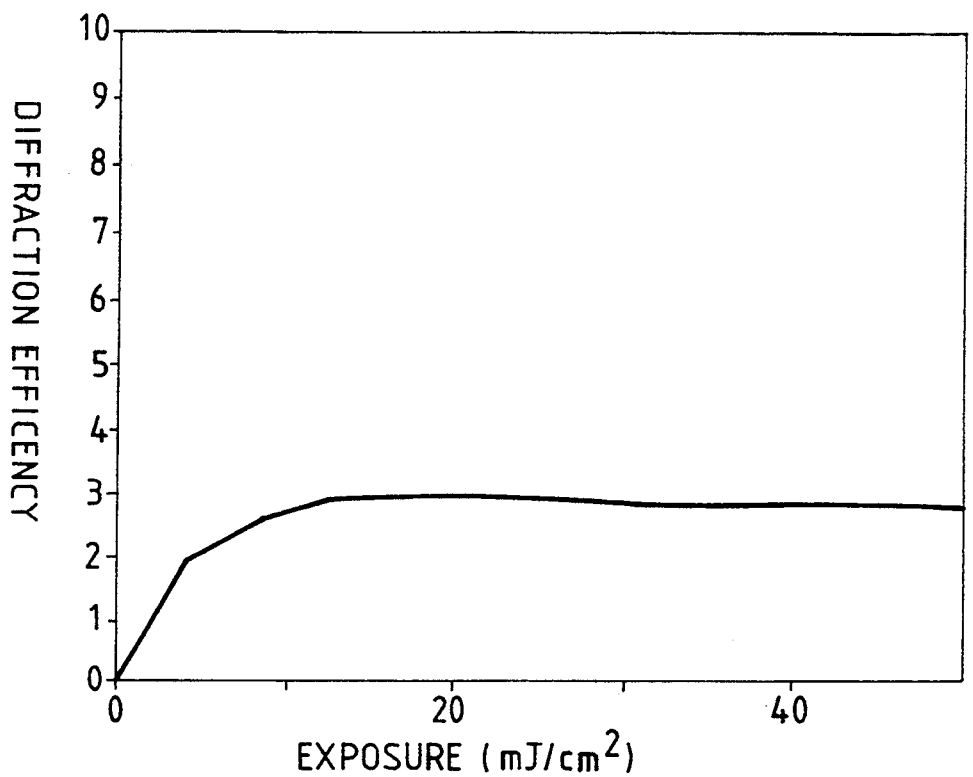
FIG. 1 is a graph showing the relationship between radiation exposure and diffraction efficiency for the hologram prepared using the photopolymerisable composition of Example 1.

The results, given in Table 1 and shown in FIG. 1, indicate that the Induction Period was too low to be measured and that the exposure (12 mJ/cm$^2$) required to reach maximum diffraction efficiency was low. These results indicate a very high degree of photosensitisation.

Comparative Example 1

Figure 2:
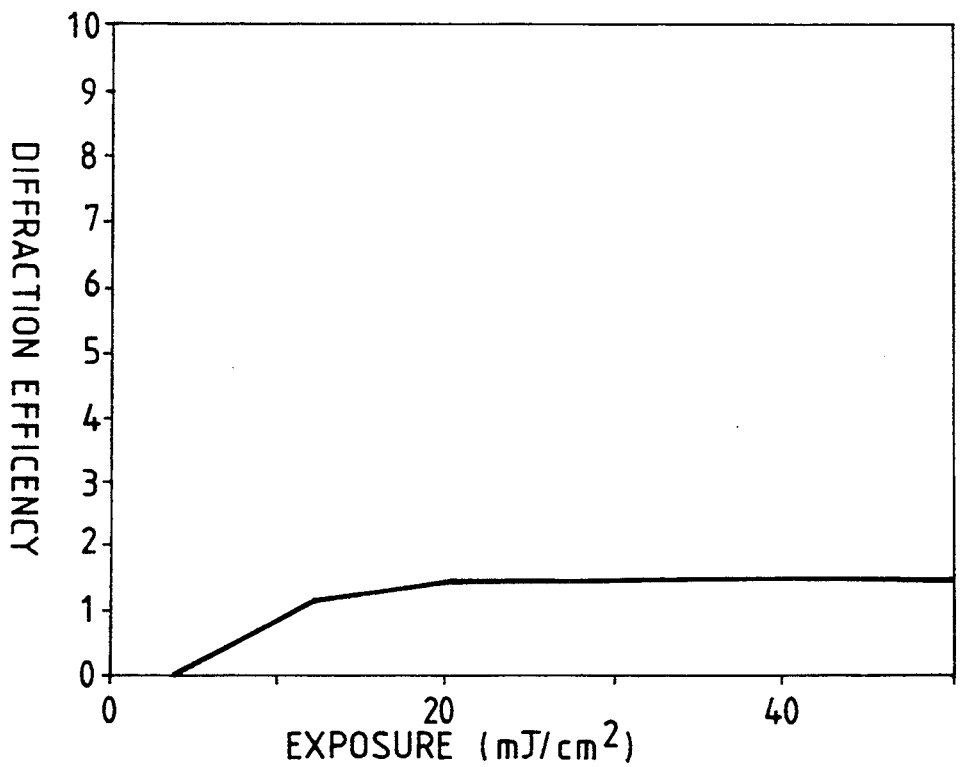
FIGS. 2 and 3 are the corresponding graphs relating to Comparative Examples 1 and 2 respectively.

A photosensitive hologram recording plate was prepared using the materials and method described in Example 1 with the exception that the N-phenylglycine was omitted from Photopolymerisable Composition 1A. The results, given in Table 1 and shown in FIG. 2, are inferior to those given by Example 1 as shown by the increased Induction Period and exposure required to reach maximum diffraction efficiency.

Comparative Example 2

Figure 3:
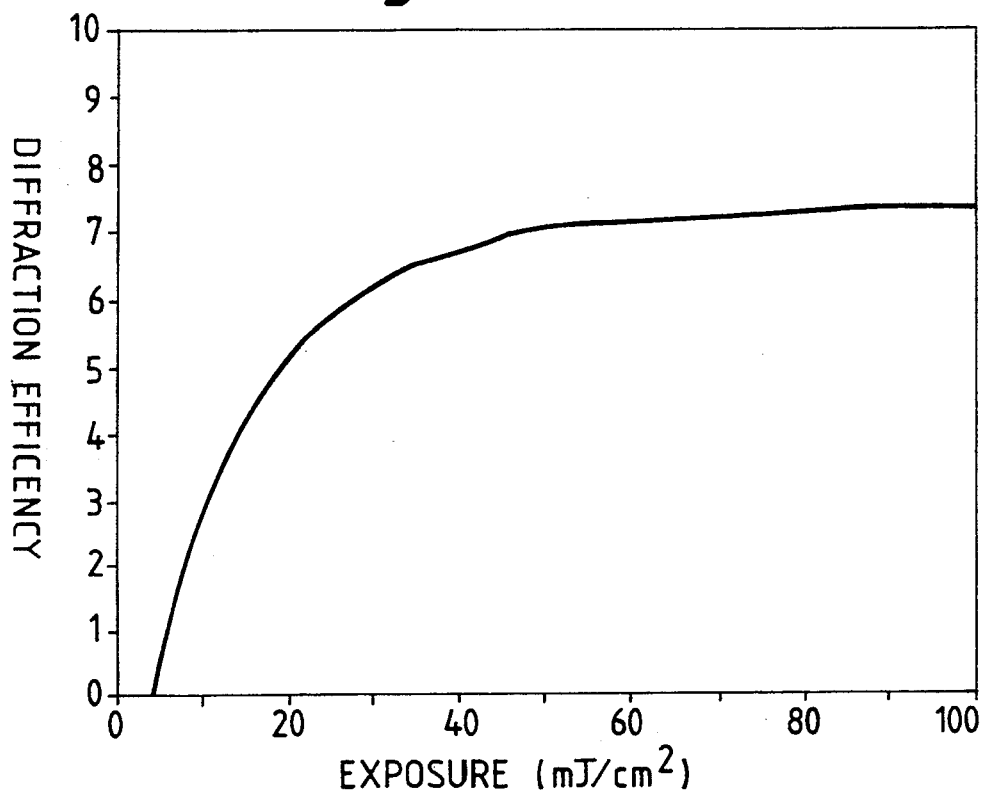
Figure 4:
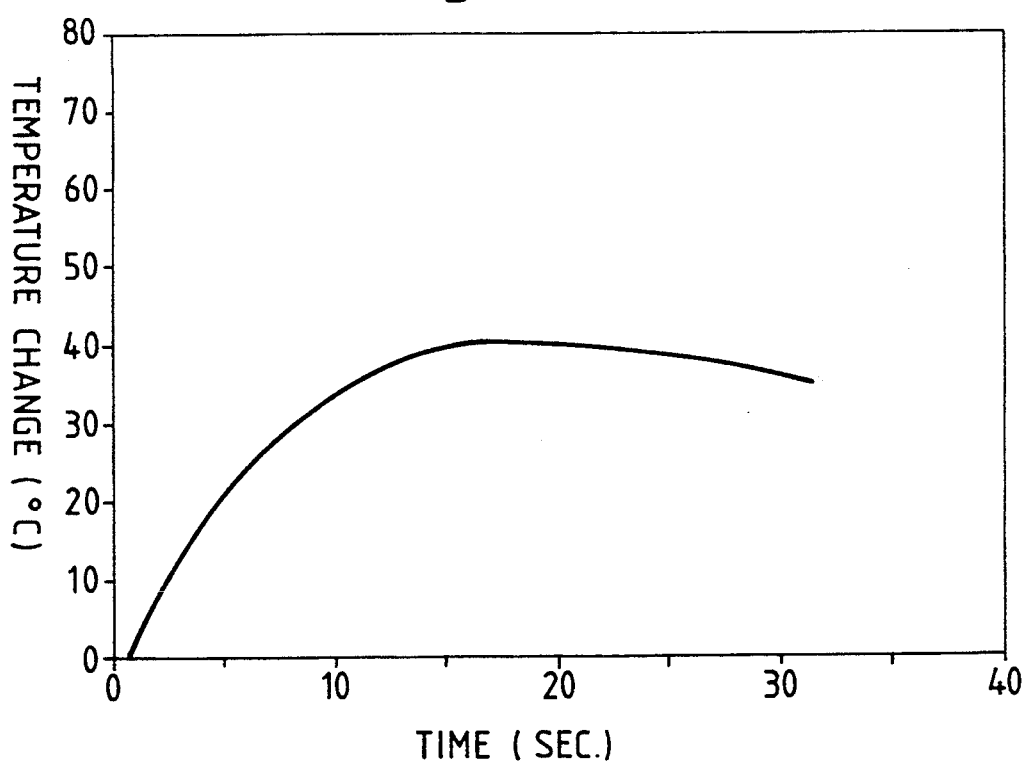
FIGS. 4, 5 and 6 are graphs showing the rate of increase in temperature during the photopolymerisation described in Examples 2-4.
Figure 5:
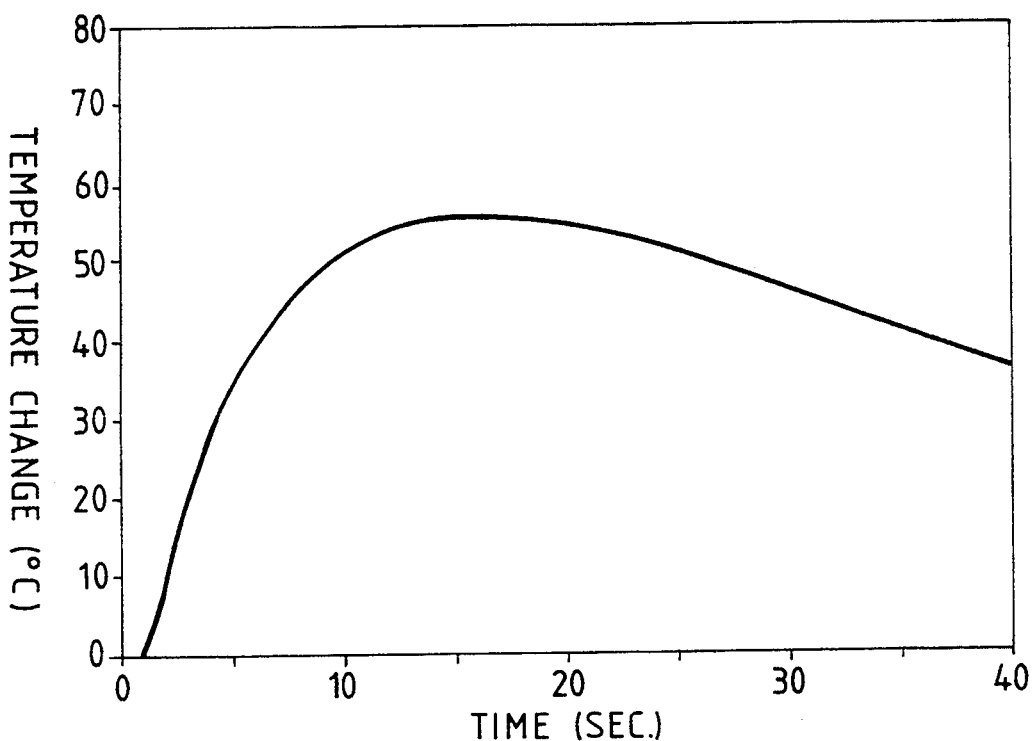
Figure 6:
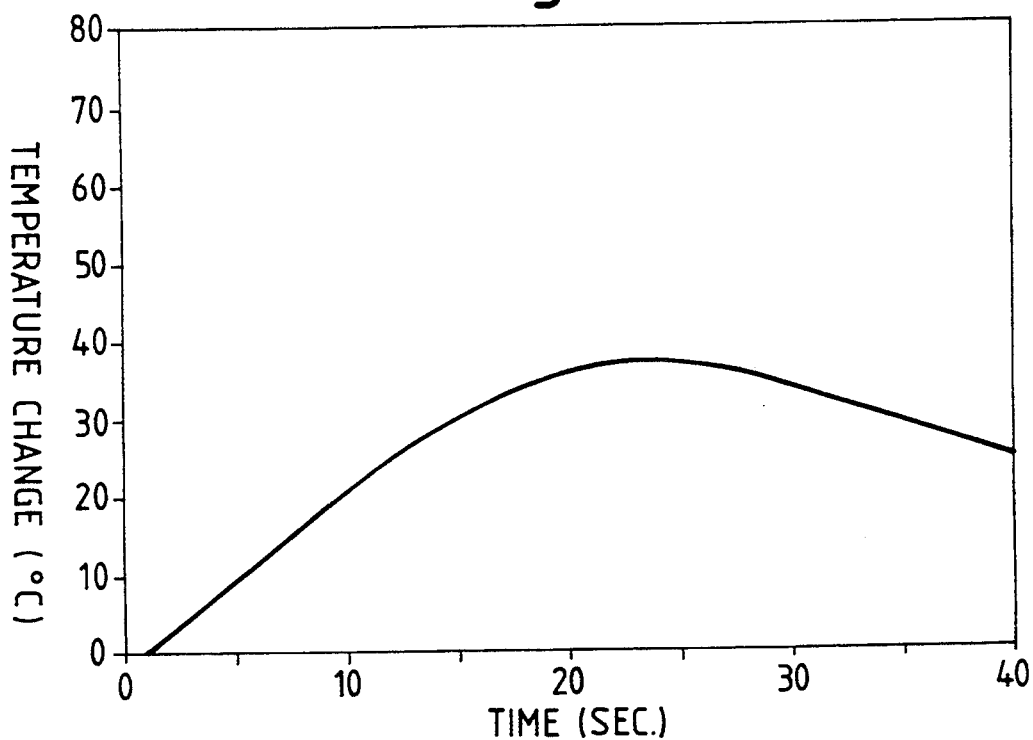
Figure 7:
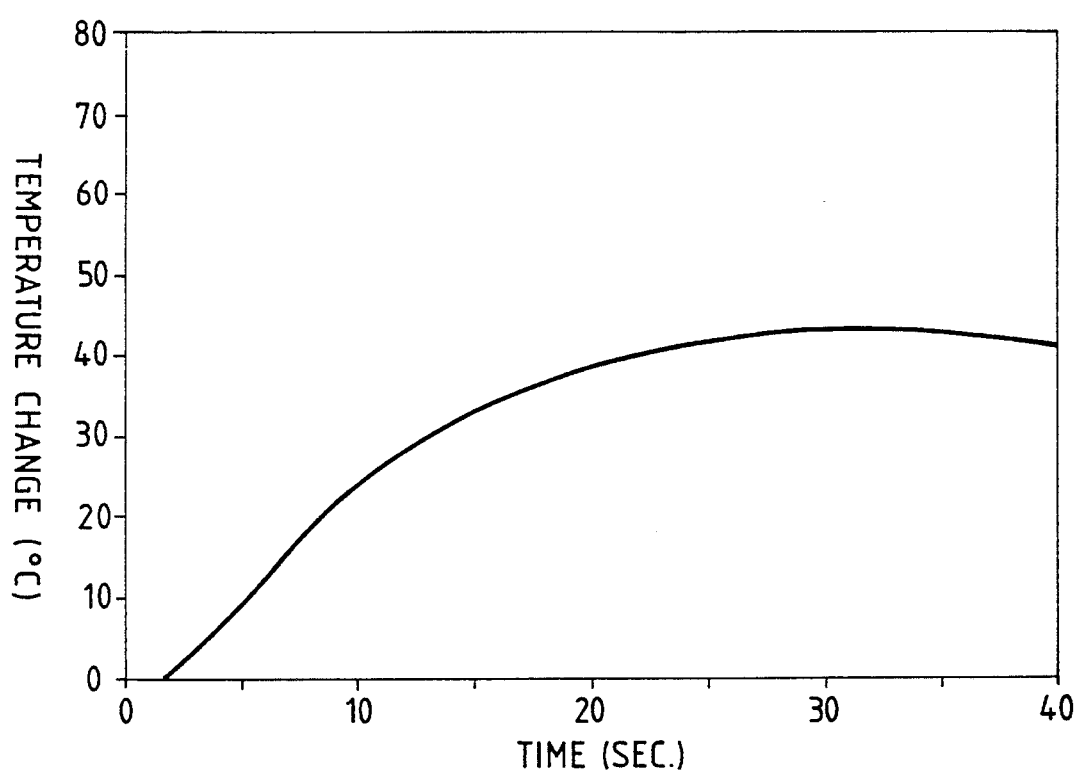
FIG. 7 is the corresponding graph relating to Comparative Example 3.

A photosensitive hologram recording plate was prepared using the materials and method described in Example 1 with the exception that the titanocene compound (CGI-784) and the N-phenylglycine were omitted and replaced by a photoinitiator composition comprising 1 part of camphorquinone, 2 parts of iso-amyl p-dimethylaminobenzoate and 0.3 part of 3,3'-carbonyl-bis(7-diethylaminocoumarin)- The results, given in Table 1 and shown in FIG. 3, are again inferior to those given by Example 1 as shown by the increased Induction Period and exposure required to reach maximum diffraction efficiency.

TABLE 1

|  | Example 1 | Comparative Example 1 | Comparative Example 2 |
|---|---|---|---|
| Induction Period (mJ/cm$^2$) | 0 | 4 | 4 |
| Exposure necessary to obtain maximum diffraction efficiency (mJ/cm$^2$) | 12 | 25 | 50 |

(The induction period expressed as mJ/cm$^2$ is the product of the induction period expressed in seconds and the intensity of the laserbeam).

Examples 2–4

Photopolymerisable compositions in accordance with the invention and a comparative composition were prepared by mixing the components indicated below.

|  | Example 2 | Example 3 | Example 4 | Comparative Example 3 |
|---|---|---|---|---|
| A-BEP-4 | 50 | 50 | 50 | 50 |
| 3EG-A | 50 | 50 | 50 | 50 |
| CGI-784 | 1 | 1 | 1 | 1 |
| N-PG | 1 | — | — | — |
| MeO-PG | — | 1 | — | — |
| CN-PG | — | — | 1 | — |

A-BEP-4 is the diacrylate of oxyethylated bisphenol A having approximately 4 oxyethylene units per molecule, a product of Shin-Nakamura Chemical Co. Ltd.

3EG-A is triethylene glycol diacrylate, a product of Kyoeisha Yushi Chemical Industries KK.

N-PG is N-phenylglycine
MeO-PG is p-methoxy-N-phenylglycine
CN-PG is p-cyano-N-phenylglycine Measurement of Photosensitivity A rubber sheet of thickness 2 mm and having an aperture 10 mm square was placed on a glass plate so as to define a cavity into which photopolymerisable composition was placed. The tip of a thermocouple was immersed in the composition which was then irradiated at right angles by an argon ion laser (488 nm) of constant intensity (10 mW/cm$^2$). The heat generated by the photopolymerisation was monitored by the thermocouple.

The induction period (IP) of the photopolymerisation reaction and the time (Tmax) required to reach the point of maximum thermal difference are given in Table 2 below for each photopolymerisable compositions. The rates of temperature increase are illustrated in FIGS. 4–7.

TABLE 2

|  | Example 2 | Example 3 | Example 4 | Comparative Example 3 |
|---|---|---|---|---|
| IP (sec) | 0.8 | 1.0 | 1.4 | 2.0 |
| (mJ/cm$^2$) | 8 | 10 | 14 | 20 |
| Tmax (tec) | 17.6 | 16 | 22.6 | 29.6 |
| (mJ/cm$^2$) | 176 | 160 | 226 | 296 |

We claim:

1. A photopolymerisable composition comprising a polymerisable ethylenically unsaturated compound and a photoinitiator composition consisting essentially of a titanocene compound and N-phenylglycine or a ring-substituted N-phenylglycine wherein the ring substitution is selected from the group consisting of $C_1$–$C_6$ alkyl, $C_1$–$C_6$ alkoxy, amino, nitro, cyano and halogen.

2. The photopolymerisable composition according to claim 1 wherein the titanocene compound has two unsubstituted or substituted cyclopentadienyl ligands and one or two unsubstituted or substituted 6-membered carbocyclic or 5-or-6-membered heterocyclic aromatic radicals attached to the titanium atom.

3. A photopolymerisable composition according to claim 2 wherein the aromatic radicals or the titanocene compound have a fluorine substituent in at least one of the two ortho positions relative to the titanium-carbon bond.

4. A photopolymerisable composition according to claim 3 wherein the titanocene compound is bis(cyclopentadienyl)-bis[2,6-difluoro-3-(1-pyrrolyl)phenyl]--titanium.

5. A photopolymerisable composition according to claim 1 wherein the unsaturated compound is an unsaturated ester obtainable by reacting one or more compounds selected from polyhydroxyaliphatic compounds and polyhydroxyaromatic compounds with acrylic or methacrylic acid.

6. A photopolymerizable composition according to claim 1 wherein the photoinitiator composition and the polymerisable ethylenically unsaturated compound are present in a weight ratio of from 1:5 to 1:500.

7. A photopolymerisable composition according to claim 6 wherein the photoinitiator composition and the polymerisable ethylenically unsaturated compound are present in a weight ratio of from 1:10 to 1:100.

8. A photopolymerisable composition according to claim 1 wherein the weight ratio of titanocene compound to N-phenylglycine compound is in the range from 10:1 to 1:10.

9. A photopolymerisable composition according to claim 8 wherein the weight ratio of titanocene compound to N-phenylglycine compound is in the range from 2:1 to 1:2.

10. A method for the preparation of a polymeric material which comprises irradiating a photopolymerisable composition as claimed in claim 1 with radiation having a wavelength which is capable of being absorbed by the titanocene compound so as to convert it to an excited state.

11. A photoinitiator composition consisting essentially of a titanocene compound and N-phenylglycine or a ring-substituted N-phenylglycine wherein the ring substitution is selected from the group consisting of $C_1$–$C_6$ alkyl, $C_1$–$C_6$ alkoxy, amino, nitro, cyano and halogen.

* * * * *

UNITED STATES PATENT AND TRADEMARK OFFICE
CERTIFICATE OF CORRECTION

PATENT NO. : 5,445,918

DATED : August 29, 1995

INVENTOR(S) : DOBA et al.

It is certified that error appears in the above-identified patent and that said Letters Patent is hereby corrected as shown below:

On the Title page, item [73] Assignee: change "Zeneca Limited, London, England" to --Ablestik Laboratories, Rancho Dominquez, Ca.--.

Signed and Sealed this

Second Day of January, 1996

Attest:

BRUCE LEHMAN

*Attesting Officer*  *Commissioner of Patents and Trademarks*